United States Patent
Yalamanchili et al.

(10) Patent No.: US 12,015,046 B2
(45) Date of Patent: Jun. 18, 2024

(54) BACK-ILLUMINATED SENSOR WITH BORON LAYER DEPOSITED USING PLASMA ATOMIC LAYER DEPOSITION

(71) Applicant: KLA Corporation, Milpitas, CA (US)

(72) Inventors: Sisir Yalamanchili, Milpitas, CA (US); John Fielden, Los Altos, CA (US); Francisco Kole, San Jose, CA (US); Yung-Ho Alex Chuang, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 314 days.

(21) Appl. No.: 17/544,413

(22) Filed: Dec. 7, 2021

(65) Prior Publication Data

US 2022/0254829 A1 Aug. 11, 2022

Related U.S. Application Data

(60) Provisional application No. 63/146,001, filed on Feb. 5, 2021.

(51) Int. Cl.
*H01L 27/146* (2006.01)
*G03F 7/00* (2006.01)

(52) U.S. Cl.
CPC .... *H01L 27/14698* (2013.01); *G03F 7/70033* (2013.01); *H01L 27/1464* (2013.01)

(58) Field of Classification Search
CPC ................................................ H01L 27/14698
See application file for complete search history.

(56) References Cited

U.S. PATENT DOCUMENTS

| | | | |
|---|---|---|---|
| 5,376,810 A | 12/1994 | Hoenk et al. | |
| 5,608,526 A | 3/1997 | Piwonka-Corle et al. | |

(Continued)

FOREIGN PATENT DOCUMENTS

| CN | 106939414 A | 8/2019 |
|---|---|---|
| CN | 106133911 A | 6/2020 |

OTHER PUBLICATIONS

Int'l. Search Report dated May 19, 2022 for PCT/US2022/014807, 4 pages.

(Continued)

*Primary Examiner* — Mounir S Amer
(74) *Attorney, Agent, or Firm* — Bever, Hoffman & Harms, LLP

(57) ABSTRACT

Back-illuminated DUV/VUV/EUV radiation or charged particle image sensors are fabricated using a method that utilizes a plasma atomic layer deposition (plasma ALD) process to generate a thin pinhole-free pure boron layer over active sensor areas. Circuit elements are formed on a semiconductor membrane's frontside surface, and then an optional preliminary hydrogen plasma cleaning process is performed on the membrane's backside surface. The plasma ALD process includes performing multiple plasma ALD cycles, with each cycle including forming an adsorbed boron precursor layer during a first cycle phase, and then generating a hydrogen plasma to convert the precursor layer into an associated boron nanolayer during a second cycle phase. Gasses are purged from the plasma ALD process chamber after each cycle phase. The plasma ALD cycles are repeated until the resulting stack of boron nanolayers has a cumulative stack height (thickness) that is equal to a selected target thickness.

20 Claims, 9 Drawing Sheets

(56) References Cited

U.S. PATENT DOCUMENTS

| | | |
|---|---|---|
| 5,999,310 A | 12/1999 | Shafer et al. |
| 6,297,880 B1 | 10/2001 | Rosencwaig et al. |
| 7,345,825 B2 | 3/2008 | Chuang et al. |
| 7,474,461 B2 | 1/2009 | Chuang et al. |
| 7,525,649 B1 | 4/2009 | Leong et al. |
| 7,586,108 B2 | 9/2009 | Nihtianov et al. |
| 7,705,331 B1 | 4/2010 | Kirk et al. |
| 7,817,260 B2 | 10/2010 | Chuang et al. |
| 7,957,066 B2 | 6/2011 | Armstrong et al. |
| 8,138,485 B2 | 3/2012 | Nihtianov et al. |
| 8,426,831 B2 | 4/2013 | Nihtianov et al. |
| 8,450,820 B2 | 5/2013 | Nanver et al. |
| 9,080,971 B2 | 7/2015 | Kandel et al. |
| 9,228,943 B2 | 1/2016 | Wang et al. |
| 9,279,774 B2 | 3/2016 | Romanovsky et al. |
| 9,470,639 B1 | 10/2016 | Zhuang et al. |
| 9,496,425 B2 | 11/2016 | Chern et al. |
| 9,723,703 B2 | 8/2017 | Bezel et al. |
| 9,818,887 B2 | 11/2017 | Chern et al. |
| 9,865,447 B2 | 1/2018 | Chuang et al. |
| 9,891,177 B2 | 2/2018 | Vazhaeparambil et al. |
| 10,121,914 B2 | 11/2018 | Chern et al. |
| 10,269,842 B2 | 4/2019 | Muramatsu et al. |
| 10,283,551 B2 | 5/2019 | Muramatsu et al. |
| 11,114,491 B2 | 9/2021 | Chuang et al. |
| 2013/0264481 A1* | 10/2013 | Chern ............... H01L 27/1462 257/432 |
| 2015/0200216 A1* | 7/2015 | Muramatsu ......... H01L 27/1464 438/72 |
| 2016/0056015 A1 | 2/2016 | Van Veen et al. |
| 2016/0343532 A1 | 11/2016 | Chuang et al. |
| 2017/0243903 A1 | 8/2017 | Ting et al. |
| 2020/0194476 A1* | 6/2020 | Chuang ............ H01L 27/14806 |
| 2021/0164917 A1 | 6/2021 | Chuang et al. |
| 2021/0320144 A1 | 10/2021 | Haddadi et al. |

OTHER PUBLICATIONS

Lee, Yong Ju et al., article entitled "Study on the characteristics of alumdinum thin films prepared by atomic layer deposition", Journal of Vacuum Science & Technology A 20, published May 3, 2002, 7 pages.

Profit, H.B., et al. article entitled "Plasma-Assisted Atomic Layer Deposition: Basics, Opportunities, and Challenges", Journal of Vacuum Science & Technology, A 29(5), published Sep./Oct. 2011 by American Vacuum Society, 26 pages.

* cited by examiner

BACK-ILLUMINATED SENSOR WITH BORON LAYER DEPOSITED USING PLASMA ATOMIC LAYER DEPOSITION

RELATED APPLICATIONS/PATENTS

This application claims priority from U.S. Provisional Patent Application No. 63/146,001, entitled "BACK-ILLUMINATED SENSOR WITH BORON LAYER DEPOSITED USING PLASMA ATOMIC LAYER DEPOSITION", which was filed on Feb. 5, 2021.

FIELD OF DISCLOSURE

The present application relates to image sensors suitable for sensing radiation in deep UV (DUV), vacuum UV (VUV), and extreme UV (EUV) wavelength, and to methods for fabricating/producing such image sensors. Some embodiments of the sensors are suitable for sensing electrons and other charged particles. All of the sensors are suitable for use in photomask, reticle, or wafer inspection systems.

RELATED ART

The integrated circuit industry requires inspection tools with increasingly higher resolution to resolve ever smaller features of integrated circuits, photomasks, reticles, solar cells, charge coupled devices etc., as well as detect defects whose sizes are of the order of, or smaller than, those feature sizes.

Inspection systems operating at short wavelengths, e.g., wavelengths shorter than about 250 nm, can provide such resolution in many cases. In other cases, electrons or other charged particles, such as helium (He) nuclei (i.e., alpha particles) may be used. Specifically, for photomask or reticle inspection, it is desirable to inspect using a wavelength identical, or close, to the wavelength that will be used for lithography, i.e., close to 193.4 nm for current generation lithography and close to 13.5 nm for future EUV lithography, as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon or particle flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the detectors are exposed to large doses of radiation after only a few months of operation.

A photon with a vacuum wavelength of 250 nm has energy of approximately 5 eV. The bandgap of silicon dioxide is about 10 eV. Although it may appear such wavelength photons cannot be absorbed by silicon dioxide, silicon dioxide as grown on a silicon surface must have some dangling bonds at the interface with the silicon because the silicon dioxide structure cannot perfectly match that of the silicon crystal. Furthermore, because the single dioxide is amorphous, there are likely also some dangling bonds within the material. In practice, there will be a non-negligible density of defects and impurities within the oxide, as well as at the interface to underlying semiconductor, that can absorb photons with deep UV wavelengths, particularly those shorter than about 250 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption. EUV photons have very high energies (13.5 nm in wavelength corresponds to photon energy close to 92 eV) and are capable of breaking silicon-oxygen bonds as well as strongly interacting with defects and contaminants in the oxide. Electron and charged-particle detectors typically have to detect electrons or charged particles with energies of a few hundred eV or higher. Energies greater than 10 eV can readily break silicon-oxygen bonds.

As indicated above, high-energy photons and particles can break bonds and ionize atoms in a silicon dioxide layer. Because silicon dioxide is a good insulator, free electrons created in the silicon dioxide may have lifetimes of ms or longer before recombining. Some of these electrons may migrate into the semiconductor material. These electrons create electric fields within the silicon dioxide and between the silicon dioxide and semiconductor. These electric fields can cause electrons created in the semiconductor by absorption of photons to migrate to the surface of the semiconductor and recombine, thereby resulting in lost signal and reduced detector quantum efficiency. Near continuous use of the instrument means that there may be little, or no, time for recovery of the detector, as new free charges are created as fast as, or faster than, they can recombine.

High-energy particles and photons can also cause irreversible changes to the silicon dioxide. Such changes can include reconfiguration of the bonding of atoms or migration of small atoms within the silicon dioxide. At normal operating temperatures of the detector, which are typically in a range from around room temperature to about 50° C., these changes will not recover. In particular, it is known that conventional silicon photodiodes used as EUV detectors degrade in efficiency with use.

The silicon dioxide layer on the surface of semiconductor detectors significantly reduces the efficiency of those detectors for low-energy (less than about 2 keV) electrons. Some low-energy electrons are absorbed by the silicon dioxide, thereby causing the silicon dioxide to charge up and deflect subsequent arriving electrons. Because a native oxide will always form on an exposed silicon surface, silicon detectors necessarily must have some oxide on their surface. Growing or depositing an alternative dielectric material (instead of the oxide) on the surface of the semiconductor results in a much higher density of defect states at the semiconductor to silicon dioxide interface. These defects reduce the quantum efficiency of the detector, especially for photons or charged particles absorbed close to the surface of the semiconductor.

An additional cause of degradation of EUV sensors is that, in a EUV system, a thin layer of carbon builds up over time on any surface exposed to EUV radiation, including the surface of the image sensors and optical elements. This carbon layer, as it becomes thicker, absorbs EUV radiation and reduces the sensitivity of the sensor, as well as reducing the reflectivity of optical elements in the light path. In a EUV system, all surfaces exposed to EUV are periodically cleaned to remove the carbon. This cleaning is usually performed with activated hydrogen (a mixture of atomic hydrogen and hydrogen radicals), which is very effective at removing carbon. However, hydrogen radicals affect the oxide on the surface of silicon detectors and can also cause degradation of the performance of those sensors.

Diode detectors suitable for detecting EUV and/or electrons are known in the art. Exemplary diode detectors are described in U.S. Pat. No. 8,138,485 issued to Nihtianov on Mar. 20, 2012, U.S. Pat. No. 7,586,108 issued to Nihtianov on Sep. 8, 2009, U.S. Pat. No. 8,426,831 issued to Nihtianov Apr. 23, 2013, and U.S. Pat. No. 8,450,820 issued to Nanver May 28, 2012. These diode detectors include a thin (1 nm to 20 nm) layer of boron directly on the silicon surface. U.S. Pat. No. 8,450,820 further describes an open mesh of a metallic conductor on the surface of such a detector.

These prior-art detectors have contacts formed on the top (light or electron-incident) surface. A disadvantage of having contacts and conductors formed on the illuminated surface is that it is not possible to create a detector with a large number (thousands or millions) of detector elements (pixels) while maintaining high detector efficiency. Each detector element requires multiple control signals, which are typically shared with other detector elements. For full-well capacities of 100,000 electrons or more, detector element dimensions may typically be in the range of about 10 μm to 20 μm. It is not possible to make hundreds or thousands of interconnects that connect these control signals to one another and to drive circuits without covering a substantial fraction of the area of the surface. Because DUV, VUV, and EUV photons and low energy particles will not penetrate through layers of conductors such as metals and polysilicon, the area covered by these conductors will have low, or no, sensitivity.

U.S. Pat. Nos. 9,496,425, 9,818,887 and 10,121,914, all to Chern et al., describe image sensor structures and methods of making image sensors that include a boron layer deposited on, at least, an exposed back surface of the image sensor. Different ranges of temperature for deposition of the boron are disclosed, including a range of about 400-450° C. and a range of about 700-800° C. The inventors have discovered that one advantage of a higher deposition temperature for the boron, such as a deposition temperature between about 600° C. and about 900° C., is that at such temperatures boron diffuses into the silicon providing a very thin, heavily p-type doped silicon layer on the light-sensitive back surface. This p-type doped silicon layer is important for ensuring a high quantum efficiency to DUV and VUV radiation because it creates a static electric field near the surface that accelerates electrons away from the surface into the silicon layer. The p-type silicon also increases the conductivity of the back surface of the silicon, which is important for high-speed operation of an image sensor, since a return path is needed for ground currents induced by the switching of signals on electrodes on the front surface of the sensor.

However, processing temperatures higher than 450° C. cannot be used on semiconductor wafers that include conventional CMOS circuits because 450° C. is close to the melting point metals such as aluminum and copper commonly used in fabricating CMOS devices. At high temperatures, such as those greater than 450° C., these metals expand, become soft and can delaminate. Furthermore, at high temperatures copper can easily diffuse through silicon which will modify the electrical properties of the CMOS circuits. Thinning a wafer before any metals are deposited on it allows a boron layer to be deposited on the back surface as described in the aforementioned patents at a temperature between 600 and 900° C. enabling boron to diffuse into the surface during, or subsequent to, the deposition of the boron layer. Subsequently metal interconnects can be formed on the front surface. After the image sensor regions of the wafer have been thinned, for example, to a thickness of about 25 μm or thinner, the thinned region can be significantly warped and may have peak-to-valley non flatness of many tens of microns or more. So, it is necessary to use relatively wide metal interconnect lines and vias, such as multiple microns wide or more, to ensure that the lines and vias connect in spite of any misalignment caused by the non-flatness. Such wide metal interconnects and vias increase the capacitance per unit area associated with those lines and vias. Furthermore, wide interconnects and vias can make it difficult, or impossible, to interconnect all the signals on a large area sensor with about one million or more pixels. In some cases, polysilicon jumpers may be needed to connect together metal interconnects, but polysilicon has much higher resistivity than any metal, so the use of such jumpers can limit the maximum operating speed of a sensor.

U.S. Pat. No. 5,376,810 to Hoenk et al. describes a delta-doping technique for image sensors that may be performed at a temperature of 450° C. or lower. This technique includes a 1.5 nm cap layer of nominally undoped silicon. This cap layer may be deliberately oxidized or may oxidize due to water and oxygen in the environment. This oxide layer will degrade under high intensity DUV, VUV, EUV or charged-particle radiation and can cause the sensor to degrade.

U.S. Pat. No. 11,114,491 to Chuang et al. issued Sep. 7, 2021, describes a method of manufacturing a back illuminated sensor utilizing a highly p-doped epitaxial silicon layer on the sensor back surface prior to boron deposition as an alternative way to obtain the static electric field to improve the sensor quantum efficiency in DUV and VUV, as mentioned previously. This low-temperature highly doped p-type epitaxial silicon layer can be grown at a temperature 450° C. or below. The deposition of pure boron at or below 450° C. can be deposited on this low-temperature epitaxial layer to enable back surface static electric field for high quantum efficiency in DUV and VUV at low temperatures. This method allows fabrication of front side metal interconnects of back thinned image sensors prior to back thinning and back side epitaxial silicon and boron processes, thus enabling sensors with finer design rules (0.35 μm or finer). This allows for narrower metal lines connecting critical features such as floating diffusion, enabling smaller floating diffusion capacitance and higher charge to voltage conversion ratios.

Pure boron layers in the above-mentioned methods are deposited via a chemical vapor deposition (CVD) process. As the CVD deposition temperature is lowered the boron layer becomes rougher. Since typical boron layers are between 2 nm and 10 nm this increased surface roughness increases the propensity for pinholes especially in extremely thin (2-5 nm) boron layers. The inventors have also discovered that boron absorbs a significant fraction of DUV radiation, and thus thinning the boron layer increases the quantum efficiency of these back thinned sensors even higher. U.S. Published Application 2021/0164917 A1 published on Jun. 3, 2021, describes methods to texture the back surface of sensors to reduce the reflection and thus improve the quantum efficiency of the back thinned sensors even higher. CVD boron deposition process can deposit boron conformally on slightly rough surfaces (Ra~5 nm) but as the aspect ratio of the surface texture increases the thickness of boron in peaks and valleys of the texture differs significantly. This non uniformity can be aggravated especially at temperatures below 450° C. as the CVD boron deposition becomes more and more rougher, thus increasing the propensity of pinholes further.

Therefore, a need arises for a back illuminated sensor fabrication method that includes a boron deposition process capable of producing thin (2 nm to 20 nm) and pinhole-free boron layers that are deposited over flat and textured surfaces at temperatures ranging from room temperature to 800° C. Such a boron deposition process would enable higher quantum efficiency using a extremely thin pinhole-free boron and/or boron deposited on a textured surface, especially in DUV. Moreover, a boron deposition process with the ability to deposit pure pinhole-free boron layers at temperatures below 450° C. enables sensor fabrication with finer design rule allowing for more flexibility in front side circuits of image sensors along with higher quantum efficiency.

SUMMARY

The present invention is directed to a method for fabricating a back-illuminated image sensor that utilizes a plasma atomic layer deposition (plasma ALD) boron layer formation process to generate a thin, pinhole-free pure boron layer over active areas of the image sensor. The present invention is also directed to back-illuminated image sensors incorporating at least one pure boron layer formed by the plasma ALD process, and to an inspection system utilizing such back-illuminated image sensor. By fabricating back-illuminated image sensors that include pure boron layers formed by the plasma ALD process described herein, the present invention provides image sensors that exhibit substantially longer operating life (i.e., in comparison to image sensors having boron layers formed using conventional processes) when utilized in inspection systems that are configured to sense deep ultraviolet (DUV) radiation, vacuum ultraviolet (VUV) radiation, extreme ultraviolet (EUV) radiation, or charged particles.

In a generalized embodiment the method begins by fabricating circuit structures on a frontside surface of a semiconductor membrane (e.g., using standard CMOS processing technology). The semiconductor membrane is then inverted and the plasma ALD boron layer formation process is implemented to form a pure boron layer on the membrane's backside surface. The plasma ALD process includes performing multiple plasma ALD cycles, where each plasma ALD cycle produces a corresponding boron nanolayer, and where the pure boron layer is collectively formed by the stack of boron nanolayers generated by the multiple plasma ALD cycles. Each plasma ALD cycle generally includes two phases: the first cycle phase involves forming an adsorbed boron precursor layer over the membrane's backside (second) surface, and the second cycle phase involves generating a hydrogen plasma over the boron precursor layer such that a gaseous reaction of the adsorbed boron precursor produces an associated boron nanolayer having a thickness of nearly one atomic layer ideally, less if precursor coverage is insufficient. In some embodiments a preliminary hydrogen plasma cleaning process is performed to remove surface oxides from the backside surface after disposing the membrane in a plasma-capable ALD deposition chamber and before beginning the boron layer formation process, thereby further enhancing the quality and purity of the pure boron layer produced by the plasma ALD process. In one embodiment the cleaning process involves exposing the membrane surface to hydrogen radicals in a plasma until the surface is saturated with hydrogen radicals, and then the plasma power source is switched off and excess hydrogen radicals and the gaseous reaction products (i.e., produced by reaction of the membrane material to hydrogen radicals) are purged from the plasma-capable ALD deposition chamber. During the first cycle phase a gas flow system is utilized to deliver (flow) a selected boron precursor into the deposition chamber while a plasma generating system of the deposition chamber remains deactivated. In some embodiments the boron precursor is selected from the group including $B_2H_6$, $BX_3$ (X=Cl/Br), $B_2F_4$, tri-methyl borane (TMB), tris(dimethylamido)borane (TDMAB), and tri-ethyl borane (TEB). The membrane remains exposed to the boron precursor until all portions of the membrane surface are saturated with boron precursor molecules. During the second cycle phase the gas flow system is utilized to deliver hydrogen gas into the deposition chamber while the plasma generating system is activated, thereby generating a hydrogen plasma that converts the adsorbed boron precursor formed during the first cycle phase into an associated boron nanolayer. Between the first and second cycle phases a first purge is performed to remove residual boron precursor gas and the gaseous reaction products of boron precursor from the deposition chamber, and a second purge is performed after the second cycle phase and before beginning a subsequent plasma ALD cycle to remove residual reactant gases from the deposition chamber. The performance of each plasma ALD cycle results in a corresponding boron nanolayer having a fixed thickness that is deposited on or over the membrane's backside surface. The plasma ALD cycle is repeated multiple times until the resulting stack of boron nanolayers has a cumulative stack height (thickness) that is equal to a selected target thickness. In a practical embodiment, the semiconductor membrane comprises epitaxial silicon having a thickness in the range of 10 µm and 40 µm, and a thickness of the pure boron layer is in the range of 2 nm to 20 nm. The plasma ALD boron deposition method provides the reliable conformal deposition of very thin (2 nm to 20 nm) and smooth boron layers on high aspect ratio textured membrane surfaces that facilitates the fabrication of superior image sensor for sensing DUV/VUV/EUV radiation or charged particles, as compared to image sensors having boron layers formed using traditional chemical vapor deposition (CVD) methods, especially at low temperatures (<450° C.). The plasma ALD boron deposition method provides a distinct advantage over traditional CVD methods in reliably forming extremely thin (2 nm to 5 nm) conformal pinhole-free boron layers for use in DUV/VUV/EUV radiation or charged particle image sensor.

In a specific embodiment the formation of frontside circuit structures includes forming a lightly p-doped (p−) epitaxial silicon layer on a semiconductor substrate, then performing front-end processing to form circuit elements (but no metal or metal interconnects) on a frontside surface of the epitaxial layer. While protecting the circuit elements, the substrate is then thinned to expose portions of the epitaxial layer's backside surface over the sensor active regions, and then the exposed backside surface is optionally textured. A pure boron layer is then formed directly on the exposed portions of the epitaxial layer using a modified version of the plasma ALD process that includes a high temperature drive-in (>800° C.) that produces a highly p-doped (p+) epitaxial silicon layer region between the pure boron layer and a retained portion of the p− epitaxial silicon layer. Back-end processing is then performed to complete the front-end circuit elements, an optional anti-reflective layer is formed over the boron layer, and then the image sensor is packaged for use.

In another specific embodiment a method of fabricating an image sensor on an SOI wafer (structure) using low-temperature ALD process begins with highly p-doping the SOI wafer's thin top silicon substrate/layer, then forming a p– epitaxial layer on the p+ top silicon layer. Completed frontside circuit elements (i.e., both front-end circuit elements and back-end metal interconnects) are then formed on the frontside surface of the p– epitaxial layer, and then a backside (second) handle wafer and/or a protective layer are formed over the frontside circuit elements to facilitate backside processing. The SOI handle substrate is then thinned/removed to expose the backside surface of the p+ top silicon layer (i.e., at least over the sensor's active regions) and then optional cleaning and processing (e.g., texturing) of the backside surface is performed. A low-temperature (<=450° C.) plasma ALD process is then performed to grow a pure boron layer on the exposed backside surface. Maintaining low temperatures (<=450° C.) during plasma ALD processing is important in this case to avoid the expansion and/or diffusion of metal components of the frontside circuit elements. An antireflection coating or a conductive coating can be formed on the boron layer to increase the transmission of wavelengths of interest that directed through the backside surface into the image sensor and/or to protect the image sensor.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

DETAILED DESCRIPTION OF THE DRAWINGS

Figure 1:
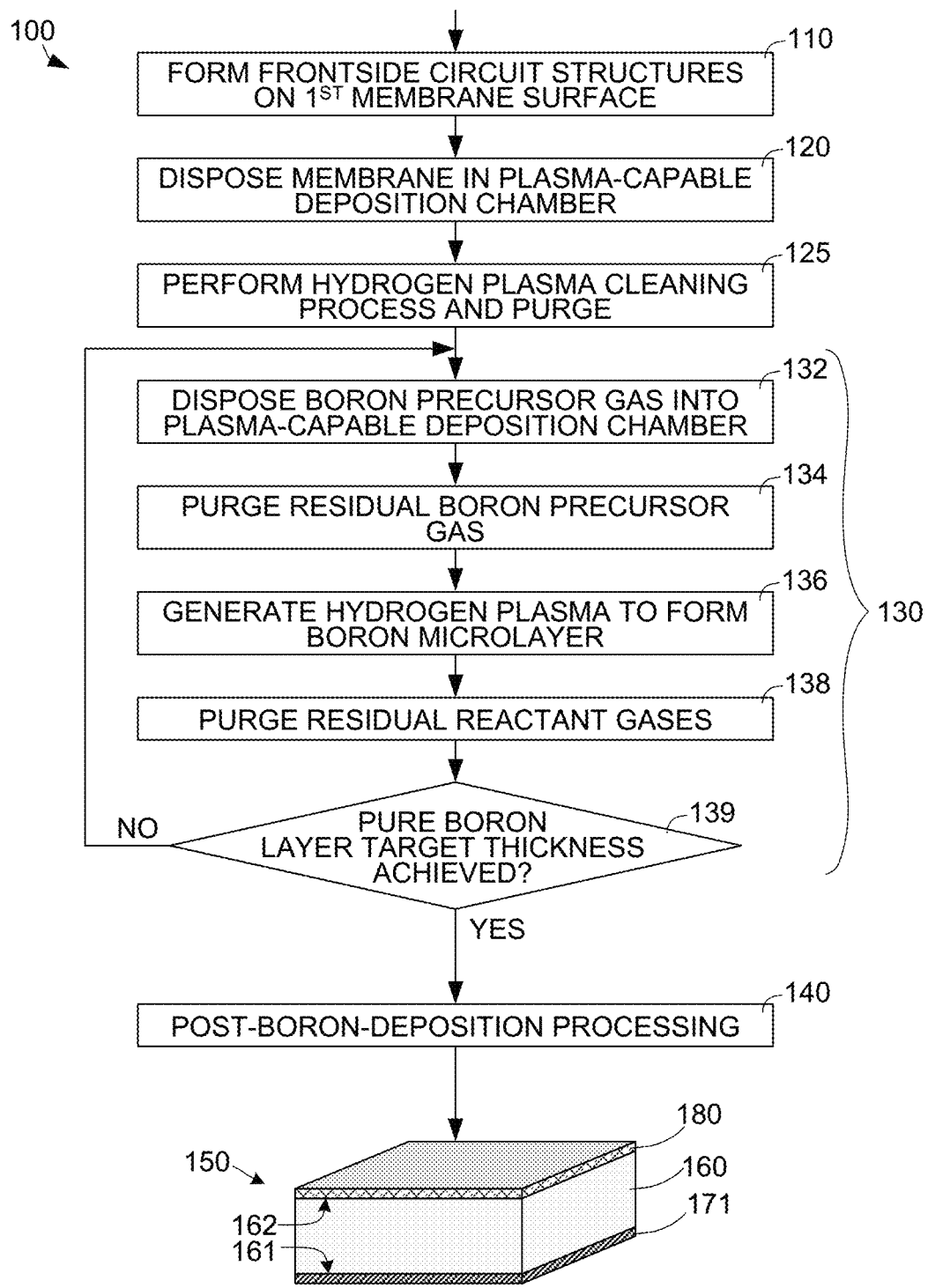
FIG. 1 is a flow diagram showing an exemplary plasma ALD boron deposition method according to an embodiment of the present invention.

FIG. 1 is a flow diagram depicting a method 100 for producing an image sensor 150 that is configured to sense DUV/VUV/EUV radiation or charged particles using a plasma ALD boron layer formation process according to a generalized embodiment of the present invention. Image sensor 150 is partially depicted in a simplified form at the bottom of FIG. 1 for reference. Additional details related to method 100 and image sensor 150 are described below with reference to FIGS. 2A through 4B.

Referring to block 110 at the top of FIG. 1 and to image sensor 150 at the bottom of FIG. 1, front-end circuit structures 171 are generated on the frontside surface 161 of a semiconductor membrane 160 using well-known integrated circuit (IC) fabrication processes such as lithography, deposition, ion implantation, annealing and etching. As known in the art, these well-known IC fabrication processes typically include front-end processes during which non-metal structures are generated in and on a layer of semiconductor material (e.g., the surface of a silicon substrate or epitaxial silicon layer), and back-end processes that include the formation of metal interconnects and other back-end circuit structures. As used herein, the phrase "semiconductor membrane" refers to one or more semiconductor material layers (e.g., a monochrome silicon substrate and/or one or more stacked epitaxial silicon layers), and the phrase "front-end circuit structures" refers to the typically non-metal structures generated in and on the semiconductor membrane during the front-end portion of a typical IC fabrication process. In contrast, the phrase "frontside circuit elements" refers to completed circuit structures that collectively perform image sensor operations and include both front-end circuit structures and back-end circuit structures (e.g., metal interconnects and other structures formed during the back-end portion of a typical IC fabrication process). When completed, the frontside circuit elements include light sensitive devices such as charge coupled devices (CCDs), complementary metal oxide semiconductor (CMOS) imagers and photodiodes, and other semiconductor devices such as transistors, diodes, resistors and capacitors that are configured to collectively perform image sensor operations when image sensor 150 is implemented in an inspection system. As set forth in the specific embodiments described below with reference to FIGS. 5 and 6, in some cases only front-end circuit structures are generated during the process of block 110, and in other cases front-end circuit structures are generated along with back-end circuit structures to provide completed frontside circuit elements. Therefore, at least the front-end circuit structures of frontside circuit elements are formed during the process of block 110. After frontside processing is completed, membrane 160 is typically cleaned thoroughly using standard cleaning RCA 1 and RCA 2, along with a dilute HF or BHF dip to remove surface contaminants and surface oxide from the surface and ensure only silicon surface or hydrogenated silicon surface is exposed to the plasma ALD process described below.

Figure 2A:
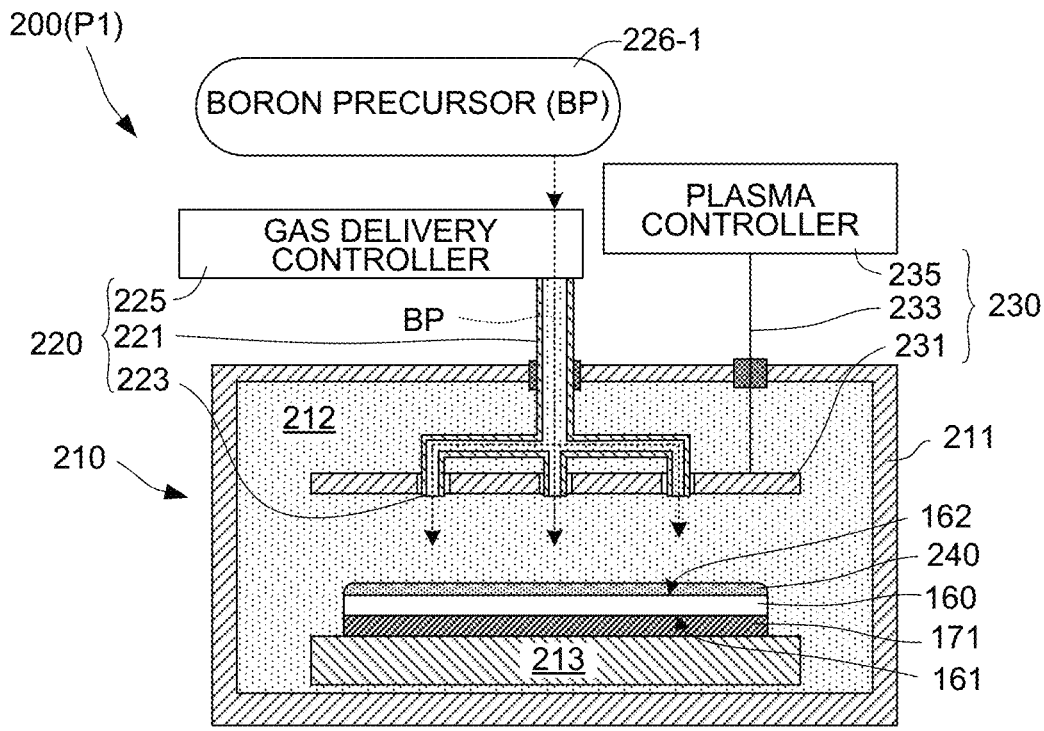
FIGS. 2A and 2B are cross-sectional views depicting a simplified exemplary plasma-capable ALD deposition chamber during corresponding phases of a plasma ALD cycle of the plasma ALD boron deposition method of FIG. 1.

In a presently preferred embodiment the frontside circuit structure formation process (block 110) is performed in processing equipment that is optimized to perform the selected semiconductor processes, and then the partially formed sensor (i.e., including membrane 160 with circuit elements 171 formed thereon) is disposed into a plasma-capable deposition chamber (block 120). As used herein, the phrase "plasma-capable deposition chamber" means any deposition chamber that is configured to expose membrane 160 (or other substrate) to the sequence of gases and plasmas required to perform a plasma ALD process. Referring briefly to FIG. 2A, an exemplary plasma-capable deposition chamber 210 generally includes a chamber wall 211 surrounding a processing region 212, a gas flow system 220 including an electrically insulated gas manifold 221 that is at least partially disposed in processing region 212, and a plasma generating system 230 including a plasma generator 231 disposed in processing region 212 that is connected by way of an insulating conductor 233 to a plasma controller 235. As described below, these structures and systems are operably configured to perform the plasma ALD boron layer formation process. As indicated in FIG. 2A, disposing membrane 160 into plasma-capable deposition chamber 210 typically involves mounting membrane 160 on a stage (support structure) 213 with first surface 161 facing downward (i.e., such that circuit structures 171 are disposed between membrane 160 and stage 213, and with second surface 162 facing upward toward outlet orifices 223 of gas manifold 221 and toward plasma generator 231. Exemplary plasma-capable deposition chamber 210 is greatly simplified and provided solely for descriptive purposes, and that features of chamber 210 provided below are not intended to be limiting unless specifically referenced in the claims. That is, those skilled in the art will recognize that plasma-capable deposition chambers suitable for performing the plasma ALD boron layer formation process described below may include features other than those depicted in FIG. 2A (e.g., a cooling/refrigeration system).

Referring to block 125 (FIG. 1), an optional hydrogen plasma clean is performed after membrane 160 is disposed inside deposition chamber 210. Sometimes it is possible for backside membrane surface 162 to have some native oxide even after the standard cleaning process described above due to delays in loading membrane 160 into deposition chamber 210 after the standard cleaning (mentioned above) is completed. In such a case an initial hydrogen plasma can be utilized to remove the surface oxide and hydrogenate backside surface 162 before beginning the plasma ALD boron layer formation process. The hydrogen plasma cleaning process involves flowing hydrogen gas with or without an inert gas (e.g., Argon) with plasma generator 231 switched on. An inert gas such as Ar helps strike plasma and maintain the required pressure in deposition chamber 210. The plasma is generated for a length of time determined by the amount of time required to maximize the hydrogenation of backside surface 162 and/or by removal of any remaining surface oxide. At the end of the cleaning process, plasma generator 231 is deactivated and excess hydrogen radicals in the plasma and the radicals of any other gas such as Ar or any other inert gas that is utilized for maintaining the chamber pressure are removed (purged). During this purge process the inert gas with or without some hydrogen is pumped through the deposition chamber to ensure removal of reactive radicals. The post-clean purge processing time is determined by the amount of time needed to remove the radicals and reaction products from deposition chamber 210.

As indicated in the central region of FIG. 1, the plasma ALD process includes performing a plurality of plasma ALD cycles 130 such that sequentially generated boron nanolayers collectively form pure boron layer 180 on backside surface 162 of membrane 160, at least on surface portions opposite to active sensor areas defined by the location of front-end circuit structures 171. Each plasma ALD cycle 130 generally includes two phases: a first phase (P1) during which an adsorbed boron precursor layer is formed over backside surface 162 (block 132), as described below with reference to FIG. 2A; and a second phase (P2) during which a hydrogen plasma is utilized to convert the adsorbed boron precursor layer into a corresponding boron nanolayer (block 136), as described below with reference to FIG. 2B. Two purge processes (blocks 134 and 138) are also performed at the end of each phase. The timing of gas flow and plasma generation are described below with reference to FIGS. 3A through 3D. As indicated by decision block 139 and described below with reference to FIG. 4A, plasma ALD cycle 130 is repeated until a thickness of pure boron layer 180 achieves a target thickness (e.g., in the range of 2 nm to 20 nm).

Figure 3A:
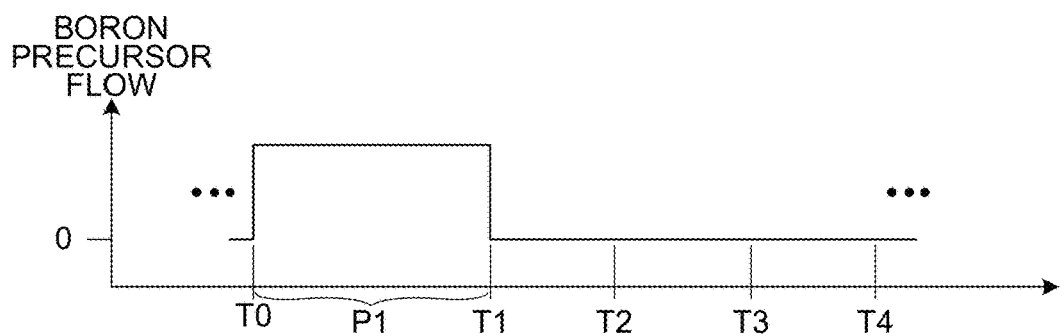
FIGS. 3A, 3B, 3C and 3D are timing diagrams depicting exemplary gas flows and plasma power levels utilized during the plasma ALD cycle of the plasma ALD boron deposition method of FIG. 1.
Figure 3B:
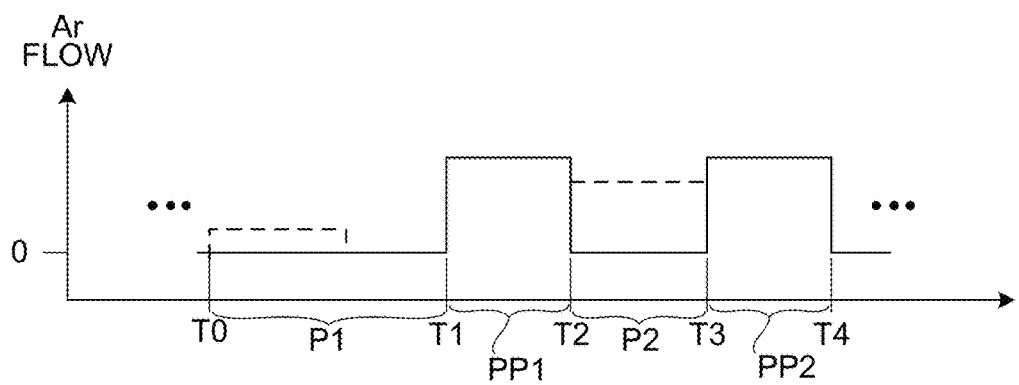
Figure 3C:
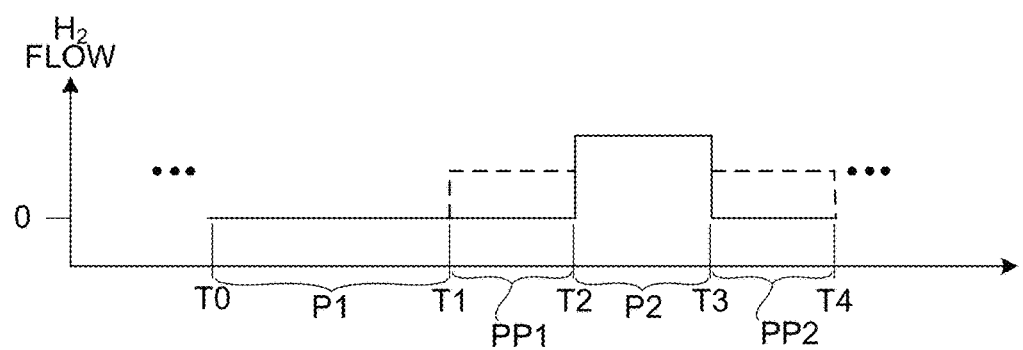
Figure 3D:
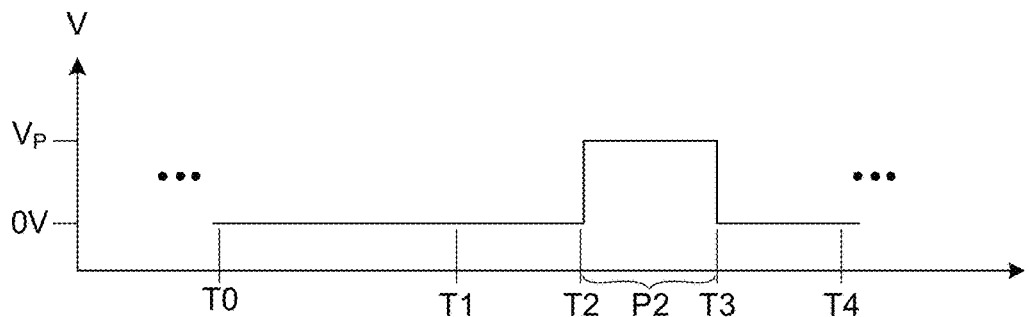

Referring to FIGS. 2A and 3A, during phase P1 adsorbed boron precursor layer 240 is formed over the backside surface 162 by disposing a boron precursor BP into processing chamber 212 between an initial cycle time T0 and a first intermediate time T1. In the exemplary embodiment this involves actuating a gas flow delivery controller 225 to flow boron precursor gas from a suitable source 226-1 through manifold 221 and into processing region 212 and otherwise controlling the process conditions inside deposition chamber 210 such that a portion of boron precursor gas BP forms boron precursor layer 240 over backside surface 162. During a first plasma ALD cycle, the predominant reaction is of boron in the boron precursor bonding to the exposed silicon of backside surface 162, and during subsequent cycles the predominant reaction is of boron in the precursor chemically bonding to exposed boron of an immediately previously formed boron nanolayer while releasing reaction products. In each case, the hydrogenated and or protonated surface reacts with boron precursor BP to bond boron atoms to the exposed material over backside surface 162. Note that plasma generating system 230 is deactivated during phase P1 (as indicated in FIG. 3D). The length of phase P1 is determined by the amount of time necessary to maximize the boron precursor reaction with the substrate surface. In alternative embodiments, boron precursor BP includes one or more of $B_2H_6$, $BX_3$ (X=Cl/Br), $B_2F_4$, tri-methyl borane (TMB), tris(dimethylamido)borane (TDMAB), and tri-ethyl borane (TEB). In one embodiment, as indicated by the dashed line between times T0 and T1 in FIG. 3C, in some embodiments an amount of $H_2$ is flown into deposition chamber 210 with boron precursor BP during phase P1.

Referring again to FIG. 1, a first purge phase (block 134) is performed at the end of phase P1 to ensure removal unreacted boron precursor and to remove (purge) gaseous reaction products from plasma-capable deposition chamber 210 and to ready membrane 160 for plasma ignition. As indicated in FIG. 3B, in one embodiment this first purge phase PP1 is performed during a period from first intermediate time T1 to a second intermediate time T2 (i.e., at the end of phase P1 and before beginning phase P2), and involves flowing Argon (or some other inert) gas into processing region 212 (e.g., using gas flow system 220, shown in FIG. 2A) such that unreacted boron precursor gas and gaseous reaction products are flushed out of deposition chamber 210. In another embodiment, as indicated by the dashed line between time T1 and T2 in FIG. 3C, in some embodiments H$_2$ is also flown into deposition chamber 210 during first purge phase PP1.

Figure 2B:
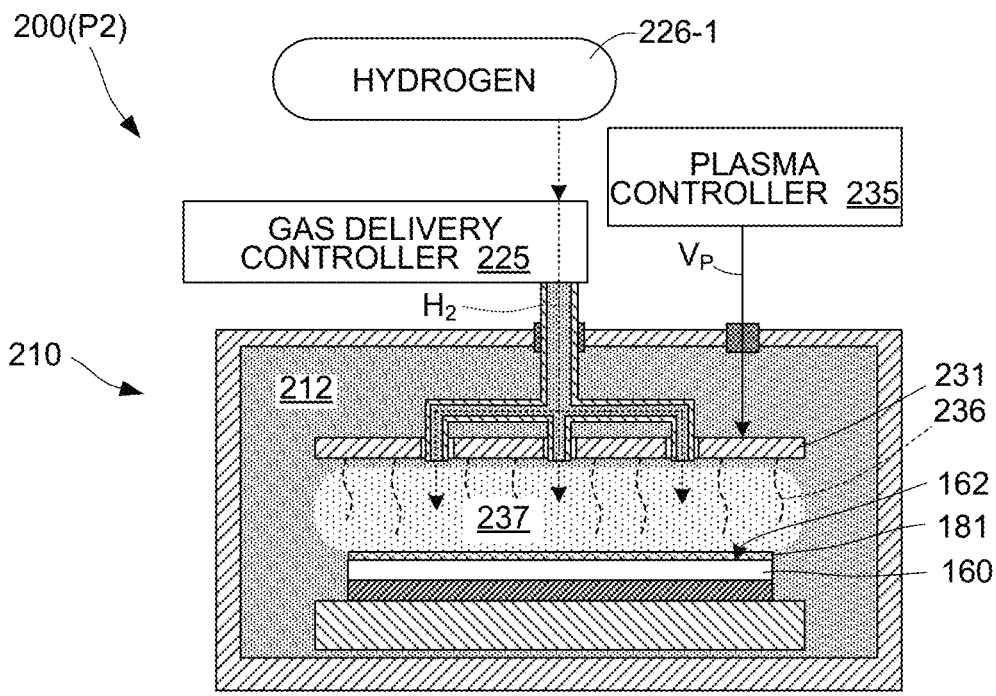

Referring to FIG. 2B, during phase P2 a hydrogen plasma 237 is generated over the boron precursor layer formed during phase P1 such that a gaseous reaction of the adsorbed boron precursor produces an associated boron nanolayer 181. As indicated in FIG. 3C, phase 2 involves delivering hydrogen gas H$_2$ into processing region 212 (e.g., as indicated in FIG. 2B, by way of controlling gas delivery controller 225 to flow gas from a source 226-1) to provide reactive protons for hydrogenation of the exposed/uppermost membrane surface. As indicated in FIGS. 2 and 3D, in one embodiment phase 2 also involves activating plasma generating system 230, for example, by causing plasma controller 233 to assert/transmit a plasma power signal V$_P$ to plasma generator 231 such that it is applied between electrode and creates a high acceleration that creates high-energy/hot electrons and ions 236 that creates and sustains plasma 237 in the portion of hydrogen gas H$_2$ disposed over membrane 160. As indicated by the dashed line between time T2 and T3 in FIG. 3B, in some embodiments argon gas (Ar) is also flown into deposition chamber 210 during phase P2 to help maintain the processing pressure and in ignition of plasma 237. Depending on the boron precursor used, the resulting reaction products can be dihydrogen gas, gaseous hydrogen halides such as HCl, HF, or HBr, CH$_4$, or C$_2$H$_6$, NH$_3$, or mono- or di-methyl ammonia, along with other possible gaseous reaction intermediaries that may be released during the reaction.

Referring again to FIG. 1, a second purge phase (block 138) is performed at the end of phase P2 to remove unreacted species and reaction products from plasma-capable deposition chamber 210 and to ready membrane 160 for a subsequent plasma ALD cycle. As indicated in FIG. 3B, in one embodiment second purge phase PP2 is performed between intermediate time T3 and a end time T4 (i.e., at the end of the current plasma ALD cycle), and involves flowing Argon gas into the processing region. In one embodiment, as indicated by the dashed line between time T3 and T4 in FIG. 3C, in some embodiments H$_2$ is also flown into deposition chamber 210 during second purge phase PP2.

Figure 4A:
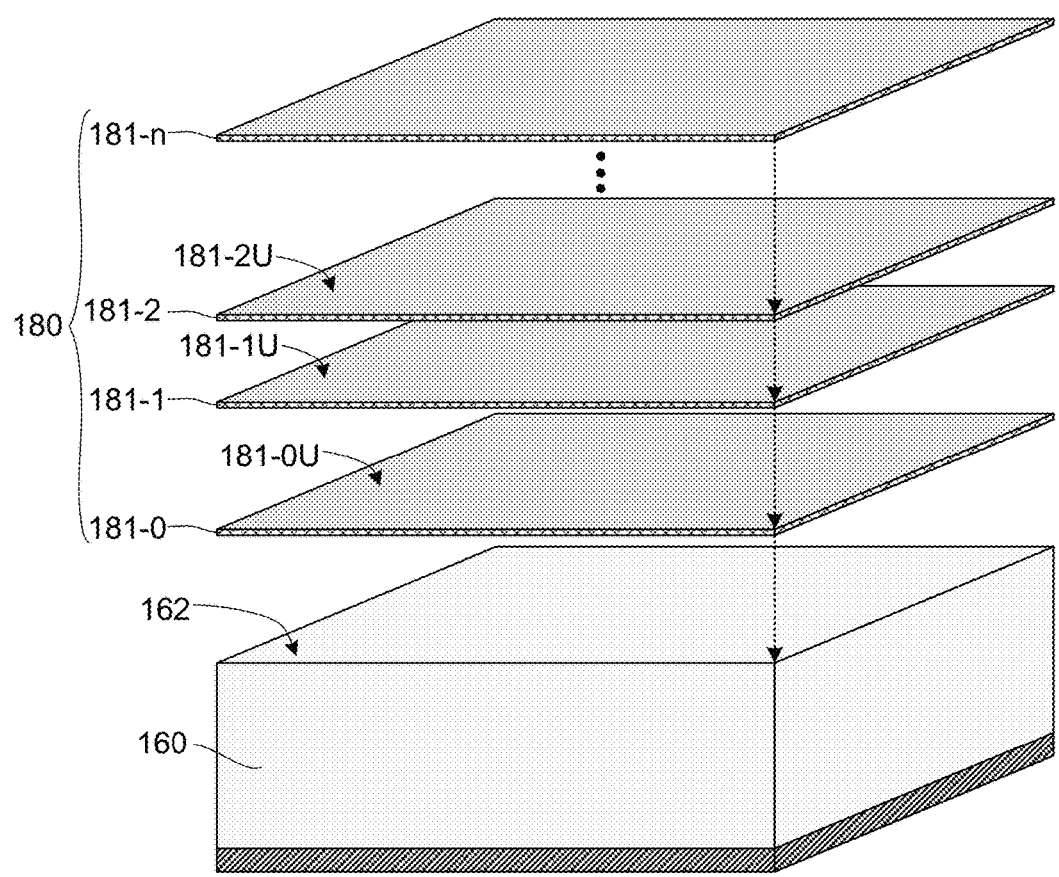
FIGS. 4A and 4B are exploded perspective views depicting a simplified image sensor produced by the plasma ALD boron deposition method of FIG. 1.
Figure 4B:
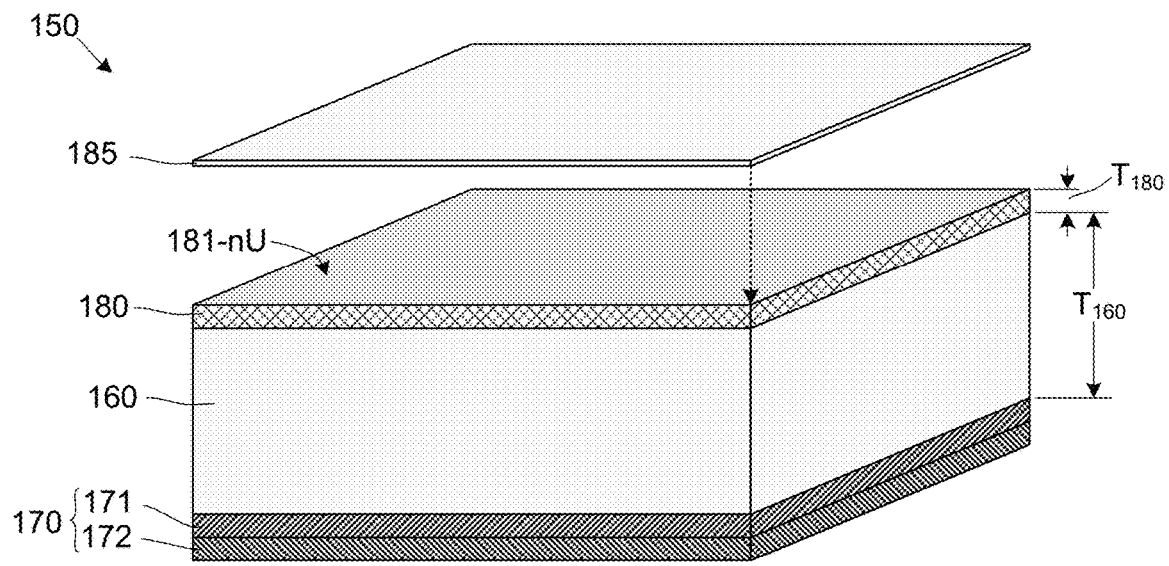

Referring to decision block 139 near the bottom of FIG. 1, the two phases and the associated purge phases of cycle 130 are repeated (typically several times) until a resulting stack of boron nanolayers has a cumulative stack height (thickness) that is equal to a selected target thickness for boron layer 180. Referring to FIG. 4A, the cumulative stack height is generated by sequentially forming multiple boron nanolayers 181-0 to 181-n on top of each other in the manner described above, where each sequentially formed nanolayer increases the cumulative stack height by a corresponding amount, thus forming pure boron layer 180 (shown in FIG. 4B) having a cumulative stack height thickness 1180. That is, a lowermost boron nanolayer 181-0 is formed directly on upper surface 162 of membrane 160 at the end of an initial plasma ALD cycle, a second boron nanolayer 181-1 is generated on upper surface 181-0U of initial boron nanolayer 181-0 at the end of a subsequently performed plasma ALD cycle, a third boron nanolayer 181-2 is generated on upper surface 181-1U of second boron nanolayer 181-1 at the end of a third plasma ALD cycle, and so on until a final boron nanolayer 181-n is generated on the upper surface of a penultimate boron nanolayer at the end of a final plasma ALD cycle. The plasma ALD cycle 130 is thus repeated until, as indicated in FIG. 4B, a thickness T$_{180}$ of the resulting pure boron layer reaches a target thickness value.

In an exemplary practical embodiment, semiconductor membrane 160 has a thickness T$_{160}$ in the range of 10 μm and 40 μm, and plasma ALD cycle 130 is repeated until a thickness of pure boron layer 180 is in the range of 2 nm to 20 nm. It is possible that the molecular structure of a pure boron layer deposited using plasma ALD may include some fractional contamination of carbon or nitrogen or halogen or inert carrier gas such as Ar, and therefore the phrase "pure boron layer" is defined herein as a molecular structure consisting of at least 80% boron atoms.

Referring to the bottom of FIG. 1, after pure boron layer 180 has been formed, additional processing (block 140) is performed to complete the fabrication of image sensor 150. As described below, some of the post-boron-deposition processing may be performed while partially completed sensor 150 is still disposed in the plasma-capable ALD deposition chamber utilized to form pure boron layer 180 (e.g., after performing both the plasma clean and plasma ALD boron deposition processes described above). Other post-boron-deposition processing may be performed after removing sensor 150 from the plasma-capable ALD deposition chamber. For example, as indicated in FIG. 4B, in some embodiments the additional processing may include completing the fabrication of frontside circuit elements 170 by forming back-end interconnects 172 on front-end circuit structures 171, and/or forming an anti-reflection coating or a conductive capping layer 185 on an uppermost surface 181 of pure boron layer 180.

Figure 5:
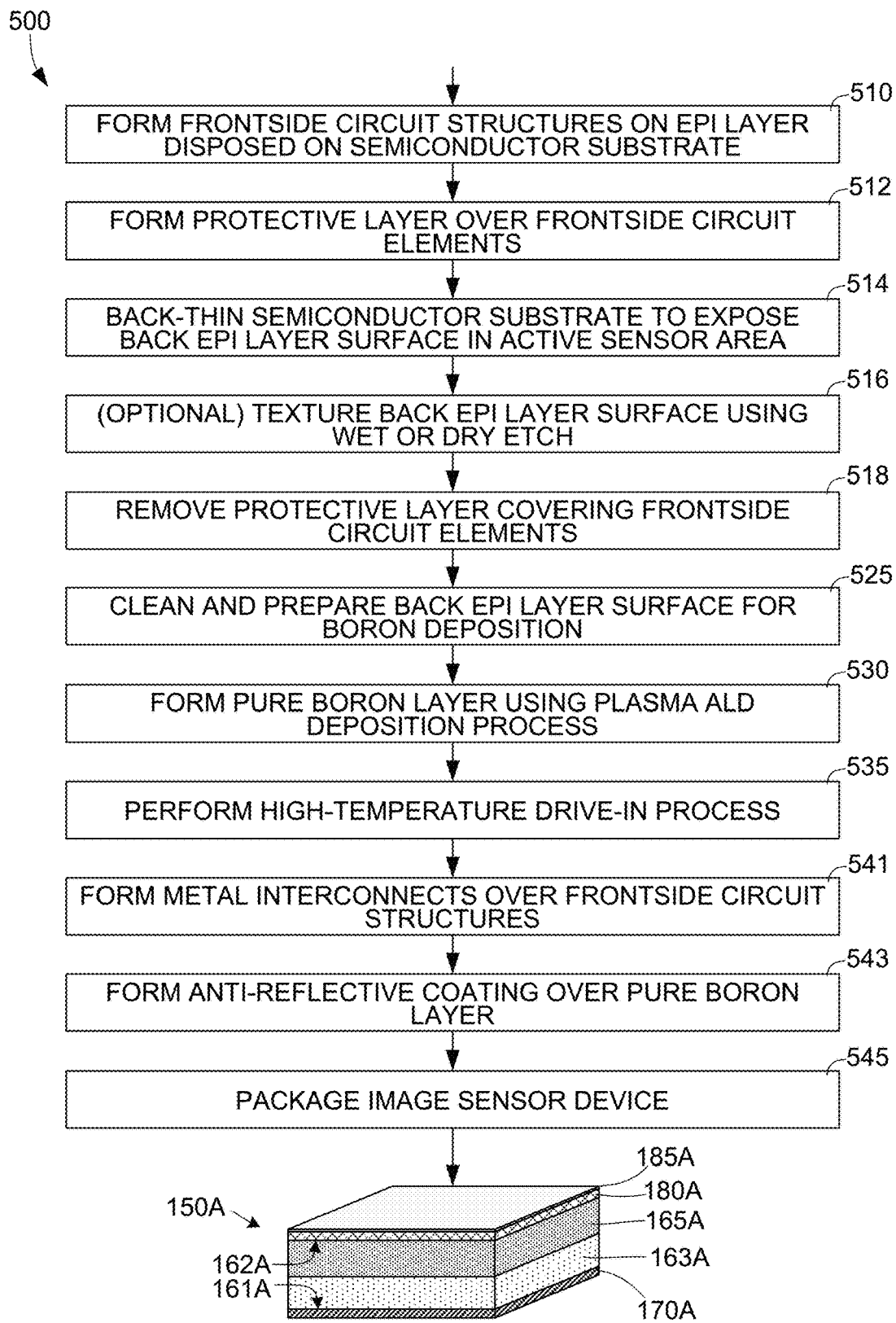
FIG. 5 is a flow diagram depicting an exemplary plasma ALD boron deposition method that utilizes a high-temperature drive-in according to another embodiment of the present invention.

FIG. 5 illustrates a method 500 for producing an image sensor 150A (partially depicted in a simplified form at the bottom of FIG. 5 for reference) using a high-temperature plasma ALD boron layer formation process according to another embodiment. Referring to block 510 at the top of FIG. 5, front-end circuit structures 171A (not including metal interconnects 172A) are generated on the frontside surface 161A of a lightly p-doped epitaxial silicon layer 163A using standard semiconductor processing steps such as lithography, deposition, ion implantation, annealing, and etching (e.g., forming one or more dielectric layers such as silicon dioxide and/or silicon nitride on frontside surface 161A as gate layers, and then completing the circuit structures by forming polysilicon and dielectric structures, but no metal structures). Charge-coupled device (CCD) and/or CMOS sensor elements may also be created during the fabrication of front-end circuit structures 171A. In preferred embodiments epitaxial layer 163A is about 10-40 μm in thickness. In preferred embodiments epitaxial layer 163A is very lightly p type doped (p−) and is formed on a semiconductor substrate. In some embodiments one or more protective (e.g., wax) layers are then deposited on front-end circuit structures 171A for protection during back-thinning (block 512), and then the semiconductor substrate is thinned (e.g., using mechanical grinding and wet etching) to expose the backside surface of epitaxial layer 163A over active sensor areas (block 514). Once the backside surface of epitaxial layer 163A is exposed, the back surface may be textured using wet or dry etching to improve quantum efficiency of the sensors as described in Chuang et al., Low reflectivity back illuminated sensor, U.S. Published Application No. 2021/0164917 A1, which is incorporated herein by reference in its entirety. The front side protection layer(s) may then be removed, e.g., by dissolving the constituent wax material using solvents such acetone and or ethanol (block 518). The exposed backside surface is then cleaned and prepared for plasma ALD boron deposition (block 525). In one embodiment, at least a portion of the cleaning is performed before the wafer/membrane (i.e., back-thinned substrate with frontside circuit structures) is placed in a plasma-capable ALD deposition chamber and includes performing a standard silicon clean procedure such as RCA 1 and RCA 2 followed by removal of surface oxide by dipping the wafer/membrane into diluted HF or BHF solution. Pure boron layer 180A is then deposited/grown (formed) on a backside surface of epitaxial layer 163A using a plasma ALD procedure that is performed as described above, for example, with reference to FIG. 1. After the thickness of pure boron layer 180A has reached a targeted thickness, a high-temperature (i.e., greater than 800° C.) thermal drive-in process (block 535) is performed to cause the diffusion of boron atoms from pure boron layer 180A into the epitaxial layer material abutting pure boron layer 180A, thereby increasing the portion's p-doping concentration and effectively forming a highly p-doped (p+) epitaxial silicon layer region 165A between p– epitaxial layer 163B and pure boron layer 180A (block 535). The drive-in process is controlled such that a portion of p-epitaxial layer 163A is retained between front-end circuit structures 171A and p+ epitaxial silicon layer region 165A. In an exemplary embodiment, p– epitaxial layer portion 163A has a resistivity of less than 10 Ωcm, and p+ epitaxial layer region 165A has resistivity is greater than 0.01 Ωcm, and a nominal p-type doping concentration of p+ epitaxial layer region 165A is at least two time a nominal p-type doping concentration of p– epitaxial layer portion 163A. The formation of p+ (second) epitaxial silicon layer portion 165A creates a back-surface accumulation that improves the quantum efficiency of the sensors especially for DUV, VUV, and EUV illuminations. In one embodiment this drive-in is performed by heating the wafer in the plasma ALD deposition chamber to 850° C. for five minutes in an $H_2$ or $N_2$ ambient. Next, the wafers are removed from the plasma ALD deposition chamber and metal interconnects 172A are fabricated over front-end circuit structures 171A using known techniques to complete the fabrication of frontside circuit elements 170A (block 541). After completion of frontside circuit elements 170A, an optional anti-reflection coating 185A, such as $Al_2O_3$, and or $HfO_2$ among other dielectric oxides, is deposited on pure boron layer 180A (block 543). The choice of dielectric and the thickness to be deposited is determined by the wavelength of operation of the sensor being fabricated. Finally, the wafer is diced and the separate sensors 150A are then packaged for operation (block 545).

Figure 6:
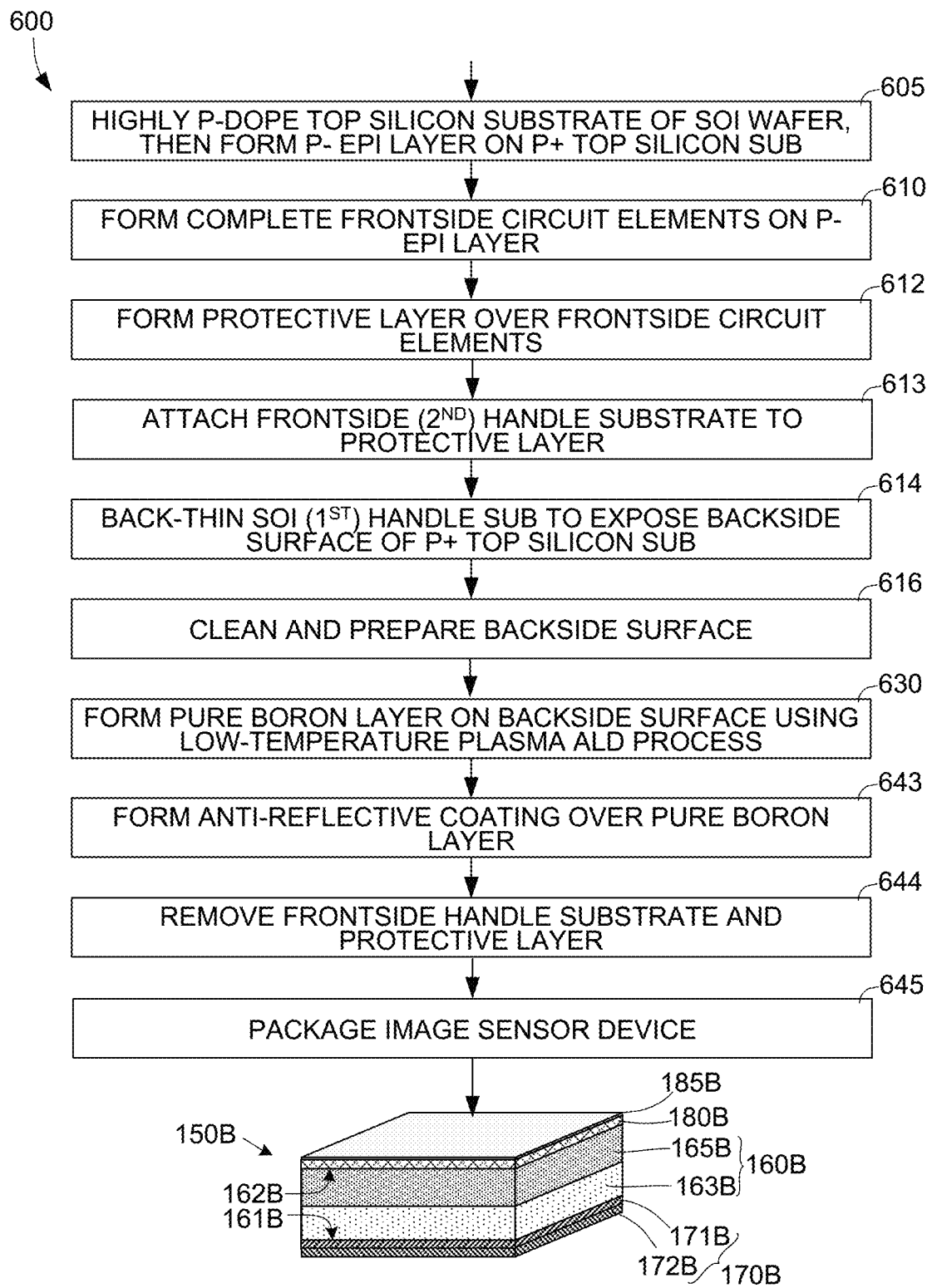
FIG. 6 is a flow diagram depicting an exemplary plasma ALD boron deposition method that utilizes a low-temperature plasma ALD process according to another embodiment of the present invention.

FIG. 6 illustrates a method 600 for producing an image sensor 150B (see bottom of FIG. 6) on an SOI wafer (structure/substrate) using a low-temperature (i.e., at or below 450° C.) plasma ALD boron layer formation process according to another embodiment. As is known in the art, SOI wafers typically include a thin top epitaxial silicon substrate mounted on an SOI (first) handle substrate by way of an intervening oxide layer. Referring block 605 at the top of FIG. 6, the thin top epitaxial silicon substrate of the SOI wafer is highly boron-doped (or highly doped using another p-type dopant), and then a thin p– (lightly p-doped) epitaxial silicon layer is grown over the top silicon substrate to form at least a portion of a semiconductor membrane 160B. In preferred embodiments both p– epi layer 163B and p+ top silicon substrate 165B have thicknesses in the range of 10-40 μm, with p– epi layer 163B having a layer resistivity of less than 10 Ωcm, and p+ top silicon substrate 165B having a resistivity greater than 0.01 Ωcm, where the nominal p-type doping concentration of p+ top silicon substrate 165B is at least two times greater than the nominal doping concentration of p– epi layer 163B. The process of p-doping top silicon substrate 165B may be omitted in cases where the SOI structure is provided with a sufficiently p-doped top silicon substrate. Referring to image sensor 150B, a downward facing surface of the epitaxial silicon (epi) layer 165B defines a frontside surface of semiconductor membrane 160B, and an upward facing surface of the highly p-doped top silicon substrate 165B defines a backside surface 162B of membrane 160B. Next, as indicated in block 610, complete frontside circuit elements 170B (i.e., both front-end circuit structures 171B and metal interconnects 172B) are generated on frontside surface 161B of p– epi layer 163B using standard semiconductor processing steps such as lithography, deposition, ion implantation, annealing, and etching. Charge-coupled device (CCD) and/or CMOS sensor elements and devices may also be created during the fabrication of frontside circuit elements 170B. In some embodiments one or more protective layers are then deposited on frontside circuit elements 170B (block 612) and then a frontside (second) handle wafer is attached over frontside circuit elements 170B (e.g., attached to membrane 160B over circuit elements 170B by way of an intervening protective layer, block 613). The SOI (first) handle substrate is then back-thinned until backside surface 162B is exposed in full or in part by a combination of grinding and/or wet etching (block 614). The exposed back surface is then optionally processed (e.g., textured using wet or dry etching to improve quantum efficiency of the sensors), and then the exposed back surface is cleaned using standard silicon cleaning procedures such as RCA 1 clean and HF or BHF dip to prepare the back surface of the exposed first epitaxial surface for low temperature epitaxial silicon growth (block 616). In one embodiment the partially formed image sensor is then placed in a plasma-capable ALD deposition chamber, and pure boron layer 180B is then deposited/grown (formed) on a backside surface 162B using a plasma ALD procedure that is performed using known techniques such that at least circuit elements 170B are maintained at temperatures equal to or less than 450° C. (block 630). In some embodiments the low-temperature plasma ALD process is performed as described above with reference to FIG. 1. By forming pure boron layer 180B at low temperatures, the metal layers forming frontside circuit elements 170B avoid damage caused by thermal expansion and diffusion that can occur at higher temperatures. An optional anti-reflection coating 185B, such as $Al_2O_3$, and or $HfO_2$ among other dielectric oxides, is then deposited on pure boron layer 180B (block 643). The choice of dielectric and the thickness to be deposited is determined by the wavelength of operation of the sensor being fabricated. Finally, the frontside handle substrate and protective layers are removed (block 644), the wafer is diced and the separate image sensors 150B are then packaged for operation using known techniques (block 645).

Figure 7A:
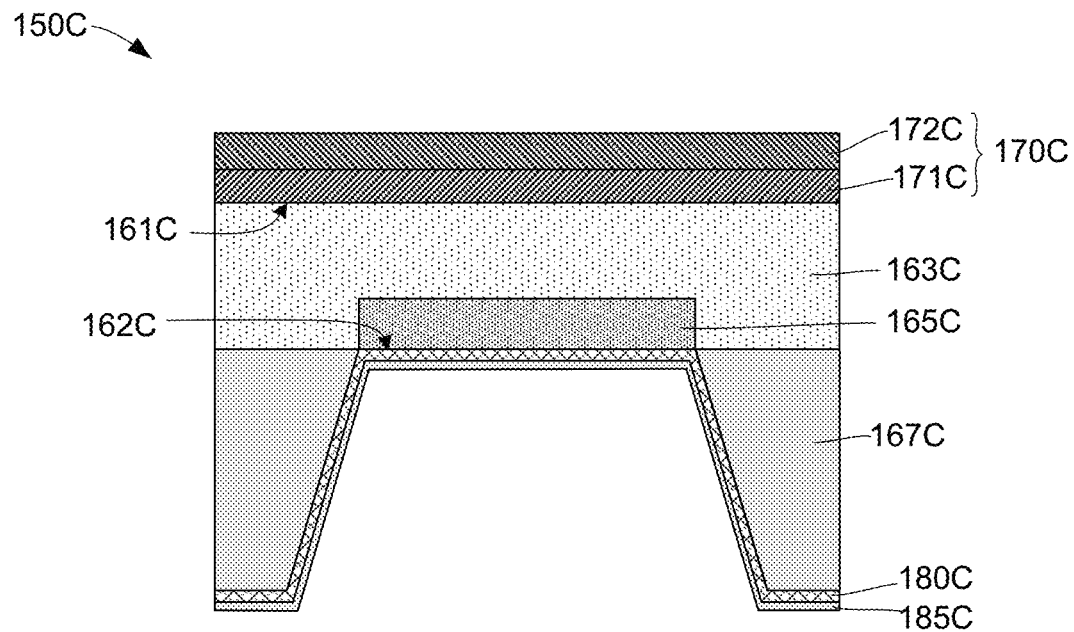
FIGS. 7A and 7B are cross-sectional side views showing back-thinned membrane image sensors including plasma ALD boron layers fabricated on a silicon substrate utilizing partial wafer thinning according to another embodiment of the present invention.
Figure 7B:
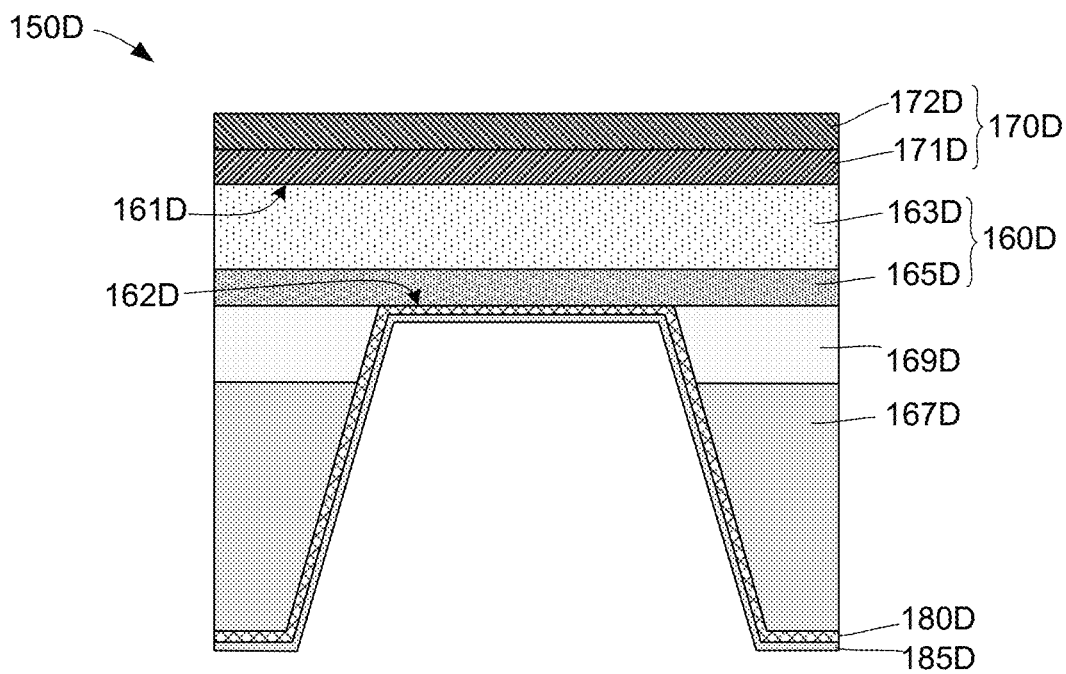

FIGS. 7A and 7B show cross section schematics of partially back-thinned image sensors 150C and 150D that are fabricated using the methods described in FIGS. 5 and 6, respectively.

Referring to FIG. 7A, image sensor 150C is fabricated using a lightly p-doped (p–) epitaxial silicon layer 163C formed directly on a silicon substrate 167C. Front-end circuit structures 171C are fabricated on a frontside surface 161C of epitaxial layer 163C and then covered by a protective layer (not shown). Portions of silicon substrate 167C located over active sensor areas are then back-thinned to expose a backside surface 162C. Pure boron layer 180C is then formed on backside surface 162C using the plasma ALD process described herein, and then a high temperature drive-in process is performed to generate highly boron doped (p+) backside (second) epitaxial region 165C to provide high back surface conductivity. Metal interconnects 172C are then formed on front-end circuit structures 171C to complete frontside circuit elements 170C, and an anti-reflection layer 185C is then formed over pure boron layer 180C to reduce the reflection and thus enhance the quantum efficiency of image sensor 150C in the wavelengths of operation. Additional details related to the formation of image sensor 150C (i.e., without a pure boron layer formed by plasma ALD) are described in Chern et al., Back illuminated sensor with boron layer, U.S. Pat. No. 9,496,425, which is incorporated herein by reference.

Referring to FIG. 7B, image sensor 150D is fabricated on a silicon-on-insulator (SOI) structure using the low-temperature plasma ALD method of FIG. 6. Because low-temperature processing is used during subsequent processing, complete frontside circuit elements 170D (i.e., both front-end circuit structures 171D and metal interconnects 172D) are formed on frontside surface 161D of a lightly p-doped epitaxial layer 163D that is grown on the SOI's thin top silicon substrate 165D. Note that top silicon substrate 165D is highly boron-doped for high back surface conductivity prior to growing p− epitaxial layer 163D. Partial back-thinning of the SOI's handle substrate 167D is then performed to expose portions of backside surface 162D of top silicon substrate 165D. Pure boron layer 180D is then formed on exposed backside surface 162D using a low temperature (<450° C.) plasma ALD boron layer formation process for long exposure lifetime, and then an antireflection coating 185D is formed on pure boron layer 180D for enhanced quantum efficiency. Sensor 150B primarily differs from sensor 150C (FIG. 7A) in that sensor 150B retains a portion of the original SOI structure's oxide layer 169D between the retained portion of handle layer 167D and p+ silicon substrate 165D. That is, p− epitaxial layer 163D and p+ silicon substrate 165D form an effective semiconductor membrane 160D of image sensor 150D, with retained oxide portions 169D and retained handle substrate portions 167D being attached to membrane 160D over non-active sensor areas. Detailed step by step fabrication schematics for producing sensor 150D are provided, for example, in Back-illuminated image sensor and method of manufacturing a sensor using a silicon on insulator wafer, Haddidi et al., U.S. Published Application No. 2021/0320144 A1, which is incorporated herein by reference in its entirety.

Figure 8:
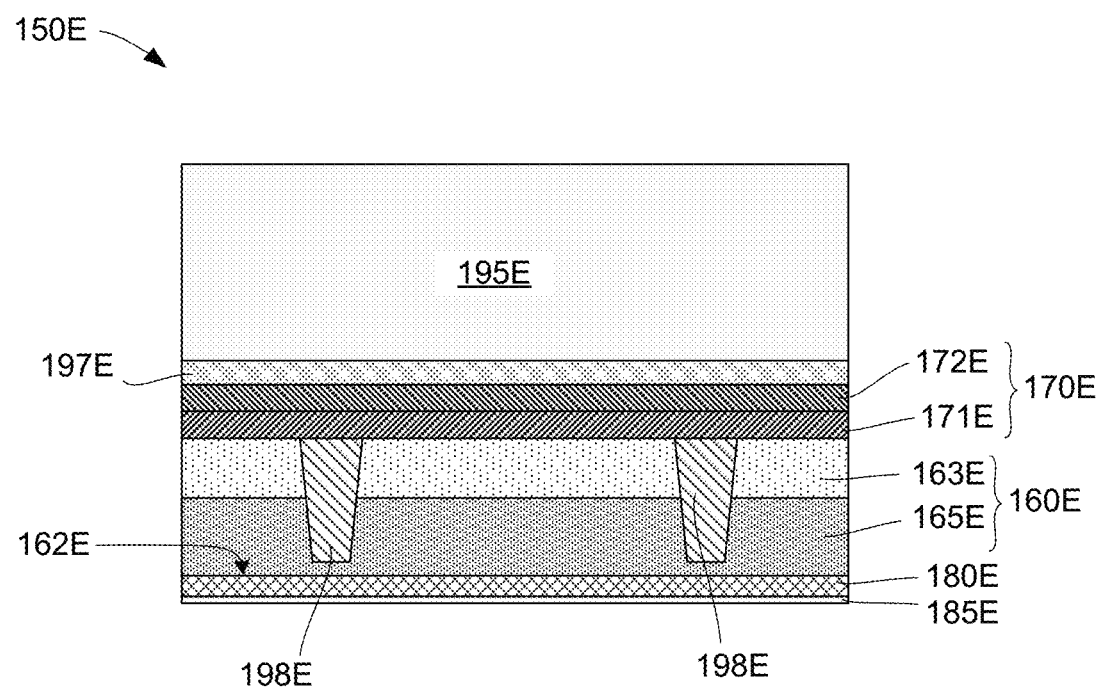
FIG. 8 is a cross-sectional side view showing a back-thinned image sensor with plasma ALD boron including plasma ALD boron layers fabricated on an SOI substrate utilizing full wafer thinning according to another embodiment of the present invention.

FIG. 8 shows another image sensor 150E having a pure plasma ALD boron layer 180E formed on an SOI substrate using the low-temperature fabrication method of FIG. 6 according to another specific embodiment. Like the example described above with reference to FIG. 7B, SOI top silicon substrate 165E is highly boron-doped for high back surface conductivity, and then a lightly p-doped epitaxial layer 163E that is grown thereon. Complete frontside circuit elements 170E (i.e., both front-end circuit structures 171E and metal interconnects 172e) are formed on frontside surface 161E of epitaxial layer 163E. In this embodiment through-silicon vias 198E are formed in p+layer top silicon substrate 165E and p− epi layer 163E to provide electrical connection between backside surface 162E and frontside circuit elements 170E. Next, a full wafer thinning process is performed to remove the entire SOI handle substrate and oxide layer (not shown), whereby semiconductor membrane 160E of image sensor 150E is formed by p− epitaxial layer 163E and p+ silicon substrate 165E. Because image sensor 150E is fabricated utilizing full wafer thinning, the method includes bonding a handle substrate 195E to the front side surface after fabrication of frontside circuit elements 170E and after forming a protective layer 197E over circuit elements 170E. Handle substrate 195E and protective layer 197E are removed after backside processing is completed, which includes forming pure boron layer 180E on highly p-doped epitaxial layer 163E using the low temperature (<450° C.) plasma ALD boron layer formation process, and then forming anti-reflection coating layer 185E over pure boron layer 180E for long term stability and higher quantum efficiency in the wavelengths of interest. In some embodiments, portions of pure boron layer 180E and highly doped epitaxial layer 163E are etched/removed to expose lower ends of through-silicon vias 198E to facilitate frontside/backside connections. Details of the fabrication procedure used to form image sensor 150E using an SOI substrate are described, for example, in U.S. Published Application No. 2021/0320144 A1, cited above. Alternatively, sensor 150E can be formed on a silicon substrate as described, for example, in U.S. Pat. No. 9,496,425, cited above.

Figure 9:
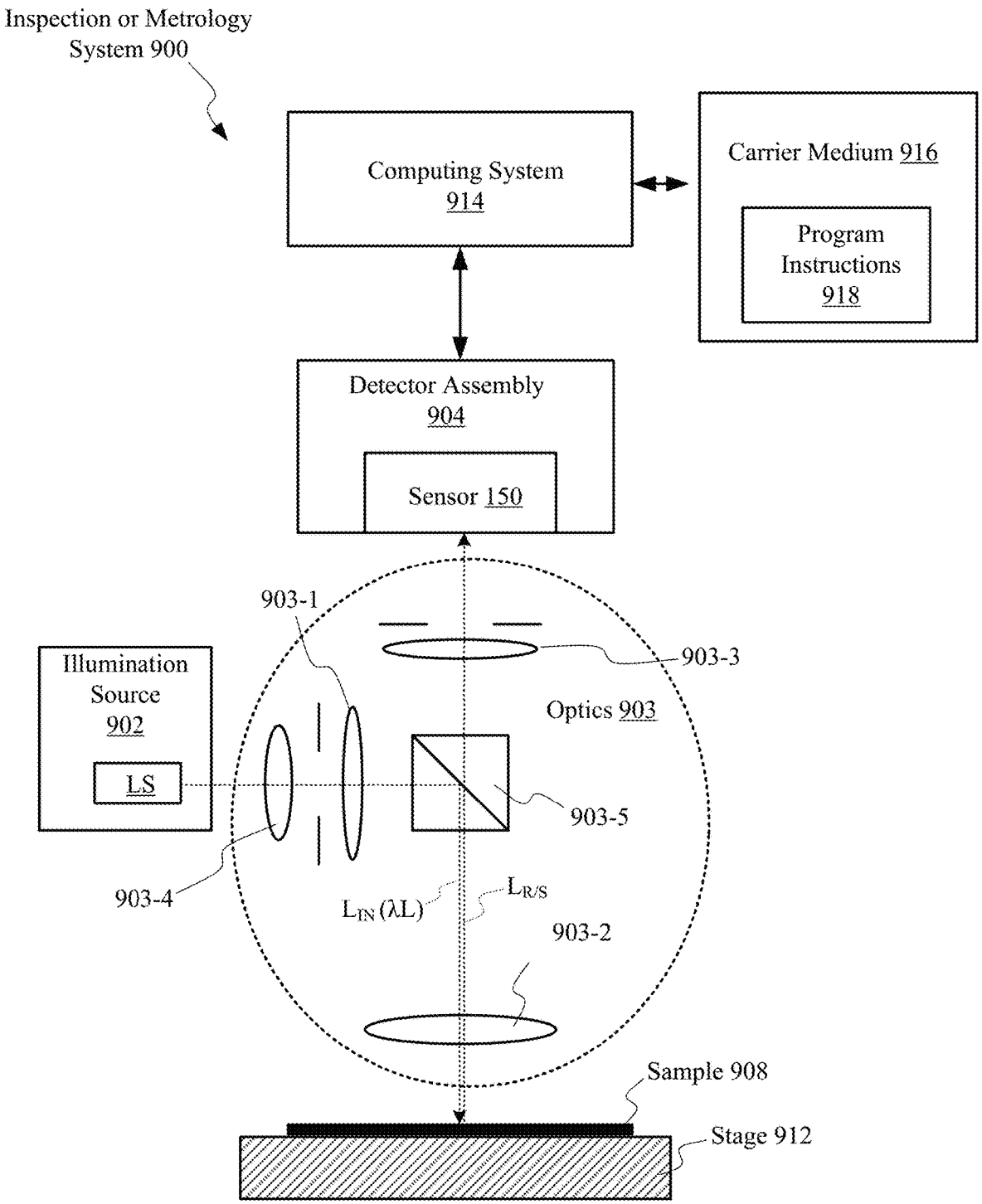
FIG. 9 is a simplified schematic diagram showing an inspection system that utilizes image sensors fabricated using a plasma ALD boron deposition method according to another embodiment of the present invention.

FIG. 9 illustrates an exemplary inspection or metrology system 900 configured to inspect or measure a semiconductor-fabrication-related sample 908, such as a silicon wafer, a reticle, or photomask. System 900 generally includes an illumination (light) source 902, a detector assembly 904 and a stage 912.

Illumination source 902 is preferably configured to generate (emit) deep UV (DUV) and/or vacuum UV (VUV) incident light (radiation) $L_{IN}$ having a wavelength in the range of 100 nm to 300 nm but may be configured to generate light having wavelengths below 100 nm (e.g., 13.5 nm for future EUV lithography) or greater than 300 nm. In some embodiments illumination source 902 utilizes one or more light sources LS and one or more optical components (e.g., a frequency converter) to generate incident light $L_{IN}$. In one embodiment, illumination source 902 may include a continuous light source, such as an arc lamp, a laser-pumped plasma light source, or a continuous wave (CW) laser. In another embodiment, illumination source 902 may include pulsed light source, such as a mode-locked laser, a Q-switched laser, or a plasma light source pumped by a mode-locked or Q-switched laser. Suitable light sources that may be included in illumination source 902 are described in U.S. Pat. No. 7,705,331, entitled "Methods and systems for providing illumination of a specimen for a process performed on the specimen", to Kirk et al., U.S. Pat. No. 9,723,703, entitled "System and method for transverse pumping of laser-sustained plasma", to Bezel et al., and U.S. Pat. No. 9,865,447, entitled "High brightness laser-sustained plasma broadband source", to Chuang et al. These patents are incorporated by reference herein.

Stage 912 is configured to receive sample 908 and to facilitate movement of sample 908 relative to optical system 903 (i.e., such that optical system 903 focuses incident light $L_{IN}$ on different regions of sample 908 and directs reflected/scattered light from the different regions to detector assembly 904). Stage 912 may comprise an X-Y stage or an R-θ stage. In one embodiment, stage 912 can adjust the height of sample 908 during inspection to maintain focus. In another embodiment, optics 93 can be adjusted to maintain focus.

Optical system (optics) 103 comprises multiple optical components and other optical components that are configured to direct and focus incident light $L_{IN}$ onto sample 908, and to direct reflected (including scattered) light $L_{R/S}$ from the sample 908 to detector assembly 904. The exemplary optical components of optical system 903 illustrated in FIG. 9 includes an illumination tube lens 903-1, an objective lens 903-2, a collection tube lens 903-3, a condensing lens 903-4 and a beam splitter 903-5. During the operation of system 900 incident light $L_{IN}$ leaving illumination source 902 is directed by condensing lens 903-4 and illumination tube lens 903-1 to beam splitter 903-5, which directs incident light $L_{IN}$ downward through objective lens 903-2 onto sample 908. Reflected/scattered light $L_{R/S}$ represents the portion of incident light $L_{IN}$ that is reflected and/or scattered in an upward direction into objective lens 903-2 by the surface features of sample 908 and is directed by objective lens 903-2 and collection tube lens 903-3 to detector assembly 904.

Detector assembly 904 includes one or more of image sensor 150 that is fabricated using any of the methods described herein. In alternative embodiments, sensor 150 includes a plasma ALD boron-coated back-illuminated CCD sensor, a plasma ALD boron-coated back-illuminated CMOS sensor, and electron-bombarded images sensor incorporating a plasma ALD boron-coated back-thinned solid-state image sensor. Image sensor 150 may comprise a two-dimensional array sensor or a one-dimensional line sensor. In one embodiment, the output of detector assembly 904 is provided to a computing system 914, which analyzes the output. Computing system 914 can be configured by program instructions 918, which can be stored on a carrier medium 916. In some embodiments of inspection system 900 incorporating a Q-switched laser, image sensor 150 or sensors 150 within detector assembly 904 are synchronized with the laser pulses. In such embodiments, image sensor 150 may operate in a TDI mode during the laser pulse and then may readout the data through multiple outputs on both sides of the sensor in between laser pulses. Some embodiments of inspection system illuminate a line on sample and collect scattered and/or reflected light in one or more darkfield and/or bright-field collection channels. In such embodiments, image sensor 150 may be a line sensor or an electron-bombarded line sensor. Some embodiments of inspection system illuminate multiple spots on sample and collect scattered and/or reflected light in one or more darkfield and/or brightfield collection channels. In such embodiments, image sensor 150 may be a two-dimensional array sensor or an electron bombarded two-dimensional array sensor.

Additional details of various embodiments of inspection or metrology system 900 are described in U.S. Pat. No. 9,891,177, entitled "TDI Sensor in a Darkfield System", to Vazhaeparambil et al., U.S. Pat. No. 9,279,774, entitled "Wafer inspection", to Romanovsky et al., U.S. Pat. No. 7,957,066, entitled "Split field inspection system using small catadioptric objectives", to Armstrong et al., U.S. Pat. No. 7,817,260, entitled "Beam delivery system for laser darkfield illumination in a catadioptric optical system", to Chuang et al., U.S. Pat. No. 5,999,310, entitled "Ultrabroadband UV microscope imaging system with wide range zoom capability", to Shafer et al., U.S. Pat. No. 7,525,649, entitled "Surface inspection system using laser line illumination with two dimensional imaging", to Leong et al., U.S. Pat. No. 9,080,971, entitled "Metrology systems and methods", to Kandel et al., U.S. Pat. No. 7,474,461, entitled "Broad band objective having improved lateral color performance", to Chuang et al., U.S. Pat. No. 9,470,639, entitled "Optical metrology with reduced sensitivity to grating anomalies", to Zhuang et al., U.S. Pat. No. 9,228,943, entitled "Dynamically Adjustable Semiconductor Metrology System", to Wang et al., U.S. Pat. No. 5,608,526, entitled "Focused Beam Spectroscopic Ellipsometry Method and System", to Piwonka-Corle et al., issued on Mar. 4, 1997, and U.S. Pat. No. 6,297,880, entitled "Apparatus for Analyzing Multi-Layer Thin Film Stacks on Semiconductors", to Rosencwaig et al., issued on Oct. 2, 2001. All of these patents are incorporated by reference herein.

The various embodiments of the structures and methods of this invention that are described above are illustrative only of the principles of this invention and are not intended to limit the scope of the invention to the embodiments described. For example, additional steps may be added, or order of the steps may be changed from what is depicted in the flow charts in FIGS. 5 and 6. Thus, the invention is limited only by the following claims and their equivalents.

The invention claimed is:

1. A method of fabricating an image sensor configured to sense at least one of deep ultraviolet (DUV) radiation, vacuum ultraviolet (VUV) radiation, extreme ultraviolet (EUV) radiation, and charged particles, the method comprising:
   forming front-end circuit structures on a first surface of a semiconductor membrane; and
   performing a plurality of plasma atomic layer (ALD) cycles such that sequentially generated boron nanolayers collectively form a pure boron layer on a second surface of the semiconductor membrane, wherein each said plasma ALD cycle includes:
   disposing a boron precursor over the second surface of the semiconductor membrane during an first phase of said each plasma ALD cycle such that an adsorbed portion of the boron precursor forms a boron precursor layer over the second surface of the semiconductor membrane; and
   generating a hydrogen plasma over the boron precursor layer during a second phase of said each plasma ALD cycle such that a gaseous reaction of the adsorbed boron precursor portion produces an associated said boron nanolayer.

2. The method of claim 1, further comprising:
   disposing the semiconductor membrane in a deposition chamber;
   cleaning the second surface of the semiconductor membrane by generating a hydrogen plasma over the second surface; and
   performing said plurality of plasma ALD cycles immediately after said cleaning,
   wherein said cleaning and said plurality of plasma ALD cycles are performed while said semiconductor membrane is continuously maintained in said deposition chamber.

3. The method of claim 2,
   wherein the deposition chamber includes a gas flow system configured to selectively deliver said boron precursor and said hydrogen into said deposition chamber, and a plasma generating system configured to generate a plasma adjacent to the second surface of the semiconductor membrane, and
   wherein disposing said boron precursor comprises controlling said gas flow system to deliver said boron precursor into the deposition chamber while deactivating said plasma generating system.

4. The method of claim 3, wherein controlling said gas delivery system comprises flowing one of $B_2H_6$, $BX_3$ (X=Cl/Br), $B_2F_4$, tri-methyl borane (TMB), tris(dimethylamido)borane (TDMAB), and tri-ethyl borane (TEB) into the deposition chamber.

5. The method of claim 3, wherein generating said hydrogen plasma comprises controlling said gas flow system to deliver hydrogen gas into the deposition chamber while activating said plasma generating system.

6. The method of claim 2, wherein each said plasma ALD cycle further comprises:

purging residual boron precursor gas from the deposition chamber during a first time period between said first phase and said second phase; and purging residual reactant gases from the deposition chamber during a second time period after said second cycle phase.

7. The method of claim 1, wherein the semiconductor membrane comprises an epitaxial layer having a thickness in the range of 10 µm and 40 µm, and wherein performing said plurality of plasma ALD cycles comprises repeating said boron precursor disposition and said hydrogen plasma generation until a thickness of said pure boron layer is in the range of 2 nm to 20 nm.

8. The method of claim 1, further comprising forming one of an anti-reflection coating and a capping layer on the pure boron layer.

9. The method of claim 1,
wherein forming the front-end circuit structures comprises forming said front-end circuit structures on a p-doped epitaxial silicon layer having a first p-type doping concentration, and
wherein the method further comprises performing a high-temperature drive-in process to form a highly p-doped epitaxial silicon layer region between a retained portion of p-doped epitaxial silicon layer and said pure boron layer.

10. The method of claim 9, further comprising forming metal interconnects over the front-end circuit structures after forming said highly p-doped epitaxial silicon layer region.

11. The method of claim 1, further comprising performing one of a wet etch and a dry etch to texture said second surface before forming said pure boron layer.

12. The method of claim 1, further comprising forming said semiconductor membrane by forming a p-doped epitaxial silicon layer having a first p-type doping concentration on a top silicon substrate of a silicon-on-insulator (SOI) wafer, wherein the top silicon substrate has a second p-type doping concentration that is greater than the first p-type doping concentration.

13. The method of claim 12, wherein forming said semiconductor membrane further comprises highly p-doping said top silicon substrate of said SOI wafer before forming said p-doped epitaxial silicon layer.

14. The method of claim 12,
wherein the SOI wafer includes a first handle substrate and an oxide layer disposed between the first handle substrate and the top silicon substrate,
wherein forming the front-end circuit structures comprises forming frontside circuit elements including front-end circuit structures disposed on a frontside surface of said p-doped epitaxial silicon layer and metal interconnects disposed over the front-end circuit structures, and
wherein the method further comprises:
attaching a second handle wafer to the semiconductor membrane over the frontside circuit elements;
back-thinning the first handle wafer to expose at least a portion of the top silicon substrate, where said exposed portion of the top silicon substrate forms the second surface of said semiconductor membrane.

15. The method of claim 12, wherein performing said plasma ALD cycles comprises maintaining the frontside circuit elements at a temperature lower than 450° C.

16. The method of claim 12, wherein the method further comprises forming through-silicon vias in the semiconductor membrane before forming the pure boron layer.

17. The method of claim 16, wherein the method further comprises etching portions of the pure boron layer to expose the through-silicon vias.

18. The method of claim 1, wherein forming said front-end circuit structures comprises fabricating one of a charge-coupled device (CCD) or a complementary metal-oxide-semiconductor (CMOS) device.

19. An image sensor for sensing at least one of: deep ultraviolet (DUV) radiation, vacuum ultraviolet (VUV) radiation, extreme ultraviolet (EUV) radiation, and charged particles, the image sensor comprising a semiconductor membrane, circuit elements formed on a first surface of the semiconductor membrane and a pure boron layer formed on a second surface of the semiconductor membrane, wherein the pure boron layer is formed in accordance with the method of claim 1.

20. An inspection system comprising: an illumination source; a set of optics including an objective lens configured to direct and focus incident light from the illumination source onto a sample and to collect, direct, and focus reflected/scattered light from the sample onto a detector assembly, wherein the detector includes one or more image sensors configured to sense at least one of deep ultraviolet (DUV) radiation, vacuum ultraviolet (VUV) radiation, extreme ultraviolet (EUV) radiation, and charged particles, wherein each said image sensor comprises a semiconductor membrane, circuit elements formed on a first surface of the semiconductor membrane and a pure boron layer formed on a second surface of the semiconductor membrane, wherein the pure boron layer is formed in accordance with the method of claim 1.

* * * * *